United States Patent
Kang et al.

(10) Patent No.: US 9,478,408 B2
(45) Date of Patent: Oct. 25, 2016

(54) SYSTEMS AND METHODS FOR REMOVING PARTICLES FROM A SUBSTRATE PROCESSING CHAMBER USING RF PLASMA CYCLING AND PURGING

(71) Applicant: Lam Research Corporation, Fremont, CA (US)

(72) Inventors: Hu Kang, Tualatin, OR (US); Adrien LaVoie, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 152 days.

(21) Appl. No.: 14/297,745

(22) Filed: Jun. 6, 2014

(65) Prior Publication Data

US 2015/0354059 A1  Dec. 10, 2015

(51) Int. Cl.
| | |
|---|---|
| H05H 1/24 | (2006.01) |
| H01L 21/02 | (2006.01) |
| C23C 16/455 | (2006.01) |
| H01J 37/32 | (2006.01) |
| C23C 16/44 | (2006.01) |

(52) U.S. Cl.
CPC ..... *H01L 21/02057* (2013.01); *C23C 16/4401* (2013.01); *C23C 16/45523* (2013.01); *H01J 37/32862* (2013.01)

(58) Field of Classification Search
CPC .................. C23C 16/4405; C23C 16/45523; H01J 37/32862
USPC ........................................................ 427/569
See application file for complete search history.

(56) References Cited

U.S. PATENT DOCUMENTS

| | | |
|---|---|---|
| 4,795,880 A | 1/1989 | Hayes et al. |
| 5,102,496 A | 4/1992 | Savas |
| 5,242,561 A | 9/1993 | Sato |
| 5,294,320 A | 3/1994 | Somekh et al. |
| 5,321,634 A | 6/1994 | Obata et al. |
| 5,401,356 A | 3/1995 | Enami et al. |
| 5,449,432 A | 9/1995 | Hanawa |
| 5,478,429 A | 12/1995 | Komino et al. |
| 5,573,597 A | 11/1996 | Lantsman |
| 5,625,170 A | 4/1997 | Poris |
| 5,672,242 A | 9/1997 | Jen |
| 5,676,759 A | 10/1997 | Ye et al. |
| 5,779,807 A | 7/1998 | Dornfest et al. |
| 5,788,871 A | 8/1998 | Huh |
| 5,788,877 A | 8/1998 | Shiflett |
| 5,854,138 A | 12/1998 | Roth et al. |
| 5,902,494 A | 5/1999 | Gupta et al. |

(Continued)

FOREIGN PATENT DOCUMENTS

| | | |
|---|---|---|
| CN | 1957437 | 5/2007 |
| EP | 0697467 A1 | 2/1996 |

(Continued)

*Primary Examiner* — Kelly M Gambetta (57) ABSTRACT

Systems and methods for operating a substrate processing system include processing a substrate arranged on a substrate support in a processing chamber. At least one of precursor gas and/or reactive gas is supplied during the processing. The substrate is removed from the processing chamber. Carrier gas and purge gas are selectively supplied to the processing chamber. RF plasma is generated in the processing chamber during N cycles, where N is an integer greater than one. The RF plasma is on for a first period and off for a second period during each of the N cycles. The purge gas is supplied during at least part of each of the N cycles.

10 Claims, 4 Drawing Sheets

(56) References Cited

U.S. PATENT DOCUMENTS

| | | | |
|---|---|---|---|
| 5,924,058 A | 7/1999 | Waldhauer et al. | |
| 6,089,181 A | 7/2000 | Suemasa et al. | |
| 6,139,923 A | 10/2000 | Gupta | |
| 6,184,489 B1 * | 2/2001 | Ito | H01J 37/32431 |
| | | | 118/723 R |
| 6,194,234 B1 | 2/2001 | Huang et al. | |
| 6,214,160 B1 | 4/2001 | Dornfest et al. | |
| 6,237,527 B1 | 5/2001 | Kellerman et al. | |
| 6,245,189 B1 | 6/2001 | Rigali et al. | |
| 6,256,825 B1 | 7/2001 | Hwang | |
| 6,286,685 B1 | 9/2001 | Kononchuk et al. | |
| 6,290,821 B1 | 9/2001 | McLeod | |
| 6,352,049 B1 | 3/2002 | Yin et al. | |
| 6,365,009 B1 | 4/2002 | Ishibashi | |
| 6,375,860 B1 | 4/2002 | Ohkawa et al. | |
| 6,423,176 B1 | 7/2002 | Ito et al. | |
| 6,428,673 B1 | 8/2002 | Ritzdorf et al. | |
| 6,517,912 B1 | 2/2003 | Morfill et al. | |
| 6,616,987 B1 | 9/2003 | Morfill et al. | |
| 6,642,531 B1 | 11/2003 | Powers | |
| 6,708,559 B2 | 3/2004 | Chen et al. | |
| 6,709,522 B1 | 3/2004 | Condrashoff et al. | |
| 6,749,717 B1 | 6/2004 | Sandhu et al. | |
| 6,777,880 B2 | 8/2004 | Morfill et al. | |
| 6,790,376 B1 | 9/2004 | Markle et al. | |
| 6,793,832 B1 | 9/2004 | Saito et al. | |
| 6,808,592 B1 | 10/2004 | Rigali et al. | |
| 6,841,033 B2 | 1/2005 | Condrashoff et al. | |
| 6,843,858 B2 | 1/2005 | Rossman | |
| 6,893,532 B1 | 5/2005 | Sato et al. | |
| 6,902,647 B2 | 6/2005 | Hasper | |
| 6,922,603 B1 | 7/2005 | Bailey, III | |
| 6,972,071 B1 | 12/2005 | Tyler | |
| 7,020,577 B2 | 3/2006 | Wilby | |
| 7,045,465 B2 | 5/2006 | Ito et al. | |
| 7,052,622 B2 | 5/2006 | Chinn et al. | |
| 7,102,763 B2 | 9/2006 | Ritzdorf et al. | |
| 7,152,461 B2 | 12/2006 | Temmler et al. | |
| 7,161,689 B2 | 1/2007 | Ritzdorf et al. | |
| 7,201,823 B2 | 4/2007 | Rigali et al. | |
| 7,335,601 B2 | 2/2008 | Han et al. | |
| 7,340,372 B2 | 3/2008 | Wilby | |
| 7,528,386 B2 * | 5/2009 | Ruzic | B08B 6/00 |
| | | | 156/345.47 |
| 7,651,586 B2 | 1/2010 | Moriya et al. | |
| 7,659,212 B2 | 2/2010 | Tsuchiya et al. | |
| 7,728,252 B2 | 6/2010 | Morikawa et al. | |
| 7,799,138 B2 | 9/2010 | Fontejon, Jr. et al. | |
| 7,892,863 B2 | 2/2011 | Wilby et al. | |
| 7,967,913 B2 | 6/2011 | Hua et al. | |
| 8,052,798 B2 | 11/2011 | Moriya et al. | |
| 8,192,806 B1 | 6/2012 | Varadarajan et al. | |
| 8,200,353 B2 | 6/2012 | Wilby et al. | |
| 8,200,447 B2 | 6/2012 | Wilby et al. | |
| 8,202,394 B2 | 6/2012 | Moriya et al. | |
| 8,282,983 B1 | 10/2012 | Kapoor et al. | |
| 8,357,548 B2 | 1/2013 | Wilby | |
| 8,364,302 B2 | 1/2013 | Kiermasz | |
| 8,367,302 B2 | 2/2013 | Kim et al. | |
| 8,501,500 B2 | 8/2013 | Yang et al. | |
| 8,591,659 B1 | 11/2013 | Fang et al. | |
| 8,603,293 B2 | 12/2013 | Koshiishi et al. | |
| 8,608,422 B2 | 12/2013 | Moriya et al. | |
| 2001/0025606 A1 | 10/2001 | Ichijo | |
| 2005/0133059 A1 * | 6/2005 | Chen | B08B 7/00 |
| | | | 134/1.1 |
| 2006/0060303 A1 | 3/2006 | Fink et al. | |
| 2006/0191479 A1 | 8/2006 | Mizukami et al. | |
| 2008/0142481 A1 | 6/2008 | White et al. | |
| 2010/0206098 A1 | 8/2010 | Wilby | |
| 2011/0011534 A1 | 1/2011 | Dhindsa | |
| 2011/0015773 A1 | 1/2011 | Wilby | |
| 2011/0160889 A1 | 6/2011 | Kuboi et al. | |
| 2011/0162674 A1 | 7/2011 | Tang et al. | |
| 2011/0272097 A1 | 11/2011 | Koshiishi et al. | |
| 2012/0158169 A1 | 6/2012 | Finn et al. | |
| 2013/0118816 A1 | 5/2013 | Wilby | |
| 2013/0149800 A1 | 6/2013 | Kiermasz | |
| 2014/0124138 A1 | 5/2014 | Gosselin | |
| 2015/0354059 A1 | 12/2015 | Kang et al. | |
| 2015/0354061 A1 | 12/2015 | Dhas et al. | |
| 2015/0357161 A1 | 12/2015 | Augustyniak et al. | |

FOREIGN PATENT DOCUMENTS

| | | |
|---|---|---|
| WO | WO2004/095502 | 11/2004 |
| WO | WO2005/119731 | 12/2005 |

* cited by examiner

SYSTEMS AND METHODS FOR REMOVING PARTICLES FROM A SUBSTRATE PROCESSING CHAMBER USING RF PLASMA CYCLING AND PURGING

FIELD

The present disclosure relates to substrate processing systems, and more particularly to systems and methods for removing particles from a substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition and/or etching of film on a substrate. Substrate processing systems typically include a processing chamber with a substrate support such as a pedestal, an electrostatic chuck, a plate, etc. A substrate such as a semiconductor wafer may be arranged on the substrate support. In chemical vapor deposition (CVD) or atomic layer deposition (ALD) processes, a gas mixture including one or more precursors may be introduced into the processing chamber to deposit a film on the substrate. In some substrate processing systems, radio frequency (RF) plasma may be used to activate chemical reactions.

Some chemical reactions that happen in the gas phase generate particles that may remain in the processing chamber after processing is completed. In addition to particles created during processing, particles may also reach the processing chamber due to dusted upstream parts, chamber leak events, contamination that occurs when replacing parts, and/or contamination that occurs during maintenance.

In some processes, purge gas is cycled on and off after the substrates are removed from the processing chamber to remove particles remaining in the processing chamber. Removing particles using purge gas cycling takes a relatively long time (~24 hours) and may not reduce particles in the processing chamber to an acceptable level.

SUMMARY

A method for operating a substrate processing system includes a) processing a substrate arranged on a substrate support in a processing chamber, wherein at least one of precursor gas and/or reactive gas is supplied during the processing; b) removing the substrate from the processing chamber; c) selectively supplying carrier gas and purge gas to the processing chamber; d) generating RF plasma in the processing chamber during N cycles, where N is an integer greater than one, wherein the RF plasma is on for a first period and off for a second period during each of the N cycles; and e) supplying the purge gas during at least part of each of the N cycles of the RF plasma In other features, the purge gas is not supplied during the first period and is supplied during at least part of the second period of the N cycles. The at least one of the precursor gas and/or the reactive gas is not supplied during (c), (d) or (e). (a) comprises depositing film using RF plasma. (a) comprises one of atomic layer deposition (ALD) and chemical vapor deposition (CVD).

In other features, the one of ALD and CVD employs RF plasma. A duty cycle of the N cycles is between 25% and 75%. (c) is performed during (d) and (e).

In other features, each of the N cycles has a duration between 1 and 5 seconds. N is greater than or equal to 100 and less than or equal to 5000. At least one of a duty cycle of the N cycles and/or a duration of the N cycles is varied during the N cycles.

A substrate processing system includes a processing chamber including a substrate support to support a substrate during processing. A gas supply selectively supplies carrier gas, purge gas and at least one of precursor gas and/or reactive gas during the processing. A controller is configured to a) supply the carrier gas to the processing chamber after the substrate is removed from the processing chamber; b) generate RF plasma in the processing chamber during N cycles, where N is an integer greater than one, wherein the RF plasma is on for a first period and off for a second period during each of the N cycles; and c) supply the purge gas during at least part of each of the N cycles of the RF plasma.

In other features, the purge gas is not supplied during the first period and is supplied during at least part of the second period of the N cycles.

In other features, the controller is configured to not supply the precursor gas and the reactive gas during (a), (b) and (c). The substrate processing system deposits film using RF plasma. The substrate processing system performs one of atomic layer deposition (ALD) and chemical vapor deposition (CVD). The one of ALD and CVD employs RF plasma. The controller is configured to control a duty cycle of the N cycles between 25% and 75%.

In other features, the controller is configured to supply the carrier gas during (b) and (c). Each of the N cycles has a duration between 1 and 5 seconds. N is greater than or equal to 100 and less than or equal to 5000. At least one of a duty cycle of the N cycles and/or a duration of the N cycles is varied during the N cycles.

A method for operating a substrate processing system includes a) removing a substrate from a substrate support in a processing chamber; b) selectively supplying carrier gas and purge gas to the processing chamber; c) generating RF plasma in the processing chamber during N cycles, where N is an integer greater than one, wherein the RF plasma is on for a first period and off for a second period during each of the N cycles; and d) supplying the purge gas during at least part of each of the N cycles of the RF plasma.

In other features, the purge gas is not supplied during the first period and is supplied during at least part of the second period of the N cycles.

A substrate processing system includes a processing chamber including a substrate support to support a substrate during processing. A gas supply supplies carrier gas and purge gas. A controller is configured to a) supply the carrier gas to the processing chamber after the substrate is removed from the processing chamber; b) generate RF plasma in the processing chamber during N cycles, where N is an integer greater than one, wherein the RF plasma is on for a first period and off for a second period during each of the N cycles; and c) supply the purge gas during at least part of each of the N cycles of the RF plasma.

In other features, the purge gas is not supplied during the first period and is supplied during at least part of the second period of the N cycles.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Cycling purge gas to remove particles in the processing chamber is not very efficient. The relatively low efficiency of purge gas in reducing particles in the processing chamber may be due in part to electrostatic force, which causes particles to stick on surfaces of the processing chamber. In addition, particles may also congregate due to electrostatic force and may be trapped inside components of the processing chamber such as a showerhead. Particles that are held by electrostatic force are difficult to remove by cycling purge gas.

The present disclosure relates to systems and methods for removing particles from processing chambers. As disclosed herein, after the substrate is removed, particles in the processing chamber may be removed by cycling RF plasma and purge gas. In some examples, the timing of the RF plasma cycles is similar to cycling that is used during ALD film deposition.

In some examples, reactant gases and precursor are not supplied during removal of the particles. Carrier gases are supplied and RF plasma is cycled on and off. Continuous or pulsed purge gas is used to remove particles from the processing chamber.

In some examples, the systems and methods according to the present disclosure may be used to remove particles from processing chambers used to deposit film by ALD or PEALD processes. Example film types include $SiO_2$, SiN, SiCN, SiC, noble metals, and high K materials including lanthanide-oxides, group 4 metals oxides and group 5 metal oxides, although other types of film and/or other processes may be involved. For example, the present disclosure may also be used to remove particles from processing chambers used to deposit film by CVD or PECVD processes. Example film types include $SiO_2$, SiN, TEOS, SiC, SiCN, and AHM, although other types of film and/or processes may be used.

According to the present disclosure, the substrate is removed after processing, carrier gas is supplied and RF power is cycled on and off to strike RF plasma. In some examples, the RF cycling may have similar timing as that used in ALD film deposition. In some examples, the substrate is removed using a robot or an indexing mechanism. Precursor and reactive gases are not supplied during the RF cycling. During the RF cycling, continuous or pulsed purge gas may be used to remove the particles from the processing chamber.

The RF cycling and purging may help to release particles that are electrostatically stuck on surfaces in the processing chamber. The particles are released during the RF cycling and exit the processing chamber along with the purge gas. In addition, particles charged by the RF plasma repel each other such that particle congregation can be drawn by the purge gas flow out of the processing chamber.

Advantages of RF cycling and purging according to the present disclosure include significantly reducing the time required to lower the particle count in the process chamber below a predetermined value. For example, 2-3 hours of RF cycling and purging as described herein may have better particle reduction performance than 24-48 hours of gas-only cycle purging. As a result, the processing chamber post-maintenance conditioning time is significantly reduced.

Figure 1:
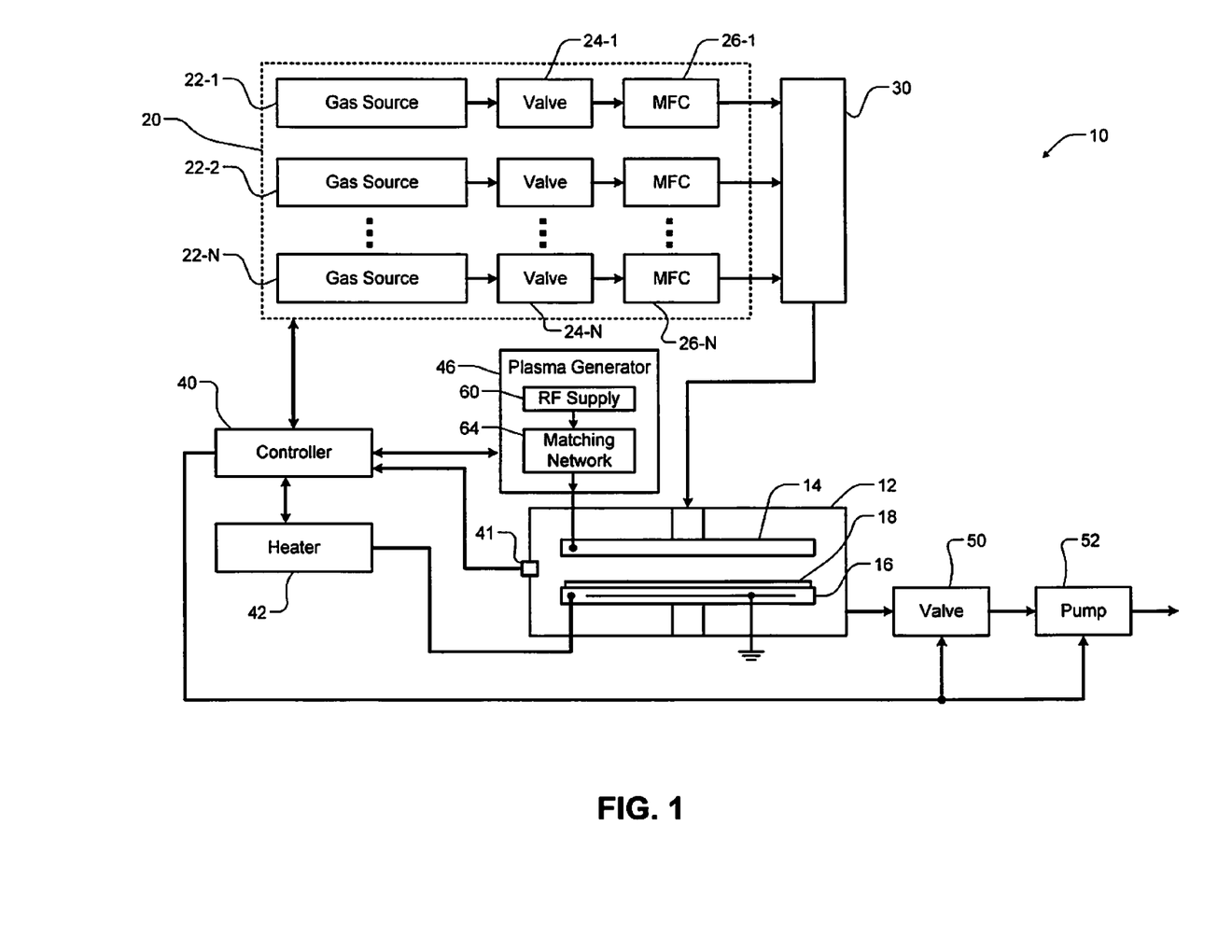
FIG. 1 is a functional block diagram of an example of a substrate processing system according to the present disclosure.

Referring now to FIG. 1, an example of a substrate processing system 10 for removing mechanical particles using RF cycling and purging is shown. The substrate processing system 10 includes a processing chamber 12. Gas may be supplied to the processing chamber 12 using a gas distribution device 14 such as showerhead or other device. A substrate 18 such as a semiconductor wafer may be arranged on a substrate support 16 during processing. The substrate support 16 may include a pedestal, an electrostatic chuck, a mechanical chuck or other type of substrate support.

A gas delivery system 20 may include one or more gas sources 22-2, 22-2, . . . , and 22-N (collectively gas sources 22), where N is an integer greater than one. Valves 24-1, 24-2, . . . , and 24-N (collectively valves 24), mass flow controllers 26-1, 26-2, . . . , and 26-N (collectively mass flow controllers 26), or other flow control devices may be used to controllably supply precursor, reactive gases, inert gases, purge gases, and mixtures thereof to a manifold 30, which supplies the gas mixture to the processing chamber 12.

A controller 40 may be used to monitor process parameters such as temperature, pressure etc. (using sensors 41) and to control process timing. The controller 40 may be used to control process devices such as the gas delivery system 20, a pedestal heater 42, and/or a plasma generator 46. The controller 40 may also be used to evacuate the processing chamber 12 using a valve 50 and pump 52.

The RF plasma generator 46 generates the RF plasma in the processing chamber. The RF plasma generator 46 may be an inductive or capacitive-type RF plasma generator. In some examples, the RF plasma generator 46 may include an RF supply 60 and a matching and distribution network 64. While the RF plasma generator 46 is shown connected to the gas distribution device 14 with the pedestal grounded or floating, the RF generator 46 can be connected to the substrate support 16 and the gas distribution device 14 can be grounded or floating.

Figure 2:
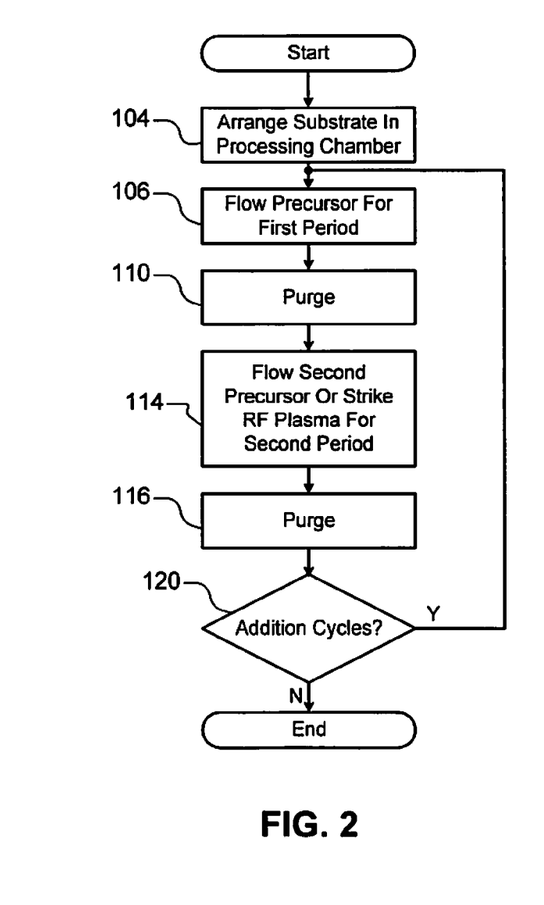
FIG. 2 is a flowchart illustrating an example of a method for performing atomic layer deposition (ALD)

Referring now to FIG. 2, an example of a method for performing atomic layer deposition (ALD) is shown. While an ALD process is shown for illustration purposes, the systems and methods described herein can apply to other types of processes including but not limited to CVD, PECVD, PEALD, etc.

At 104, a substrate is arranged in a processing chamber. Processes gases such as one or more carrier gases or inert gases may be supplied to the processing chamber. At 106, a first precursor is supplied to the processing chamber for a first period. After the first period, the processing chamber is purged at 110. At 114, a second precursor may be supplied to the processing chamber for a second period to react with the first precursor. Alternately or additionally, RF plasma may be struck in the processing chamber to convert the first precursor. After a second period, the processing chamber is purged at 116. At 120, one or more additional ALD cycles are performed and control returns to 106. Otherwise, when the ALD cycles are complete, control ends. When processing is completed, the substrate is removed from the processing chamber.

Figure 3:
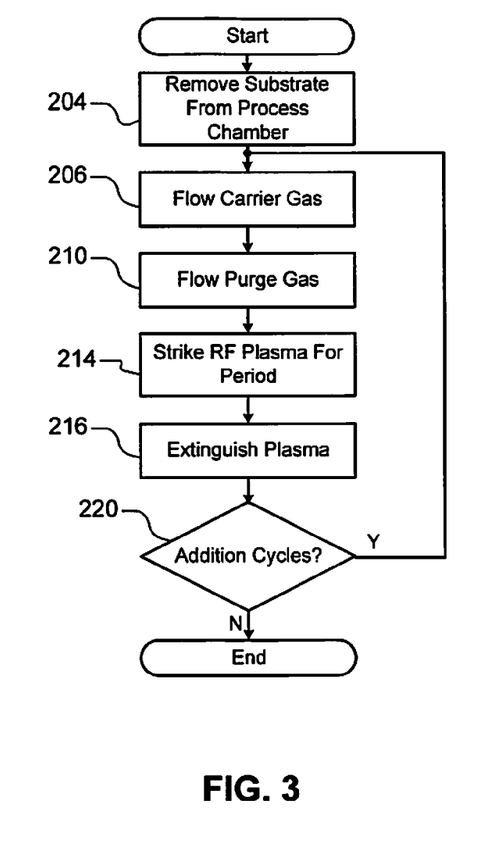
FIG. 3 is a flowchart illustrating an example of a method for removing particles from a substrate processing chamber according to the present disclosure.

Referring now to FIG. 3, an example of a method for removing particles from a substrate processing chamber is shown. The systems and methods described herein are performed after the substrate is removed from the processing chamber. In this example, the purge gas remains on during the RF plasma cycling and purging. At 204, the substrate is removed from the processing chamber. At 206, carrier gas is supplied to the processing chamber. At 210, purge gas is supplied to the processing chamber. At 214, RF plasma is struck for a predetermined period. At 216, the RF plasma is extinguished after the predetermined period. When additional RF plasma cycles are to be performed (as determined at 220), control continues with 206. When the predetermined number of cycles is completed, control ends.

Figure 4:
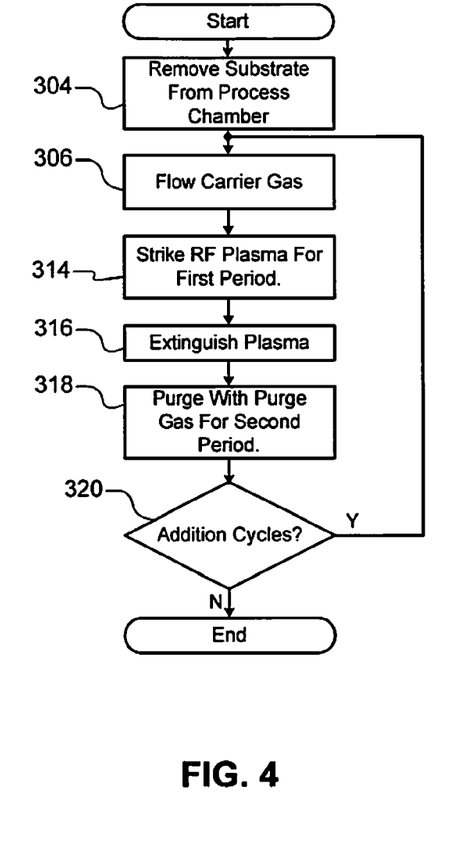
FIG. 4 is a flowchart illustrating another example of a method for removing particles from a substrate processing chamber according to the present disclosure.

Referring now to FIG. 4, another example of a method for removing particles from a substrate processing chamber is shown. In this example, the purge gas is cycled on and off after the RF signal is turned off. At 304, a substrate is removed from the processing chamber. At 306, carrier gas is supplied to the processing chamber. At 314, RF plasma is struck for a first predetermined period. At 316, the RF plasma is extinguished after the first predetermined period. At 318, the processing chamber is purged with purge gas for a second predetermined period after the RF plasma is extinguished. If additional RF plasma and purge cycles are needed, control continues with 306. When a sufficient number of cycles are completed, control ends.

Figure 5:
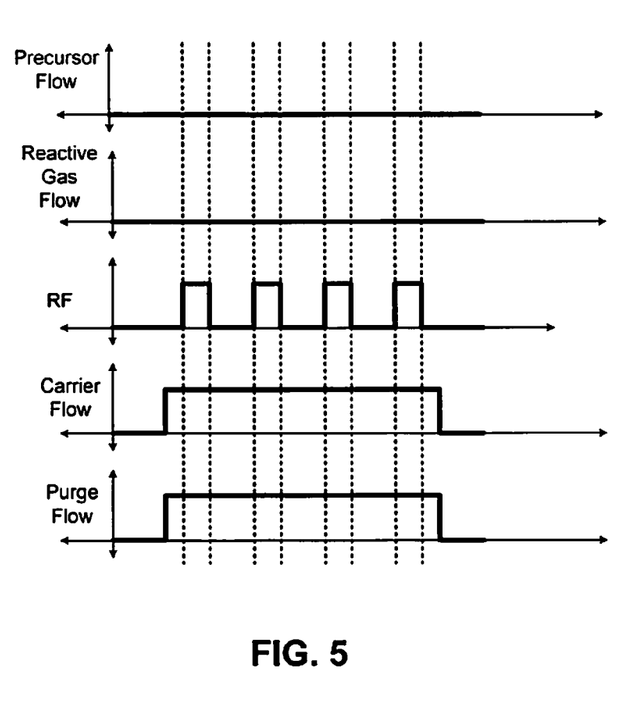
FIGS. 5 and 6 are graphs illustrating timing of control signals for supplying precursor, reactive gas, carrier gas, purge gas, and RF plasma when removing particles from the processing chamber according to the present disclosure.
Figure 6:
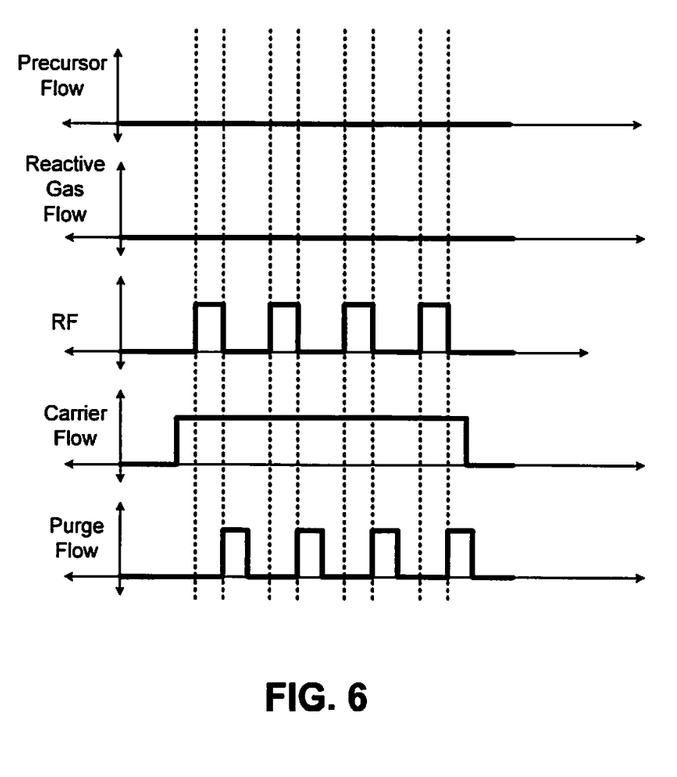

Referring now to FIGS. 5 and 6, graphs illustrating examples of timing of control signals for supplying precursor, reactive gas, carrier gas, purge gas, and RF are shown. The timing shown in FIG. 5 corresponds to the method described in FIG. 3. The precursor and reactive gases are not supplied to the processing chamber. Carrier gas and purge gas are supplied during RF pulses.

The timing shown in FIG. 6 corresponds to the method described in FIG. 4. The precursor and reactive gases are not supplied to the processing chamber during the RF plasma cycling and purging. Carrier gas is supplied during the RF chucking. The purge gas is pulsed for a predetermined period after falling edges of the RF pulses. While the purge gas is shown as stopping a predetermined period before leading edges of a subsequent RF pulse, the purge gas may also be supplied until the leading edges or just after the leading edges of the subsequent RF pulses. In some examples, a duty cycle of the RF cycling is between 25% and 75%. In other examples, the duty cycle and the period can be varied during particle removal. Varying the duty cycle and/or duration may help to dislodge particles. In some examples, the RF cycles are 1 to 5 seconds long, although other durations may be used. In some examples, 100 to 5000 cycles are performed, although additional or fewer cycles may be used. In some examples, 2000 to 3000 cycles are performed, although additional or fewer cycles may be used.

In one example, the processing chamber was dusted after a chamber leak event. 10 hours of purge gas-only cycling reduced the chamber mechanical particles to ~1000 adders. This approach required another 22 hours of purge gas-only cycling to further reduce the chamber mechanical particles to <30 adders @ 0.06 µm as shown in Table I:

TABLE I

| Particle Tests | Particle adders | |
|---|---|---|
| Tool recovery after leak event | >0.06 µm | >0.12 µm |
| Run gas-only cycle purge for 10 hours | | |
| Mechanical gas only particle test 400 Cycles | 1141 | 213 |
| Run gas-only cycle purge for another 10 hours | | |
| Mechanical gas only particle test 400 Cycles | 478 | 101 |
| Run gas-only cycle purge for another 12 hours | | |
| Mechanical gas only particle test 400 Cycles | 14 | 6 |

In another example, the substrate processing tool suffered high particle count for an ALD Ox process after a showerhead leak issue. Using 24 hour purge gas-only cycling, the processing chamber mechanical particle count was still at ~100. Next, using RF cycling and purging for 2 hours, the processing chamber mechanical particle count dropped to ~30 adders. Another 1 hour of RF cycling and purging further reduced the mechanical particle count as shown in Table II:

TABLE II

| | Tool recovery from leak | | | | |
|---|---|---|---|---|---|
| | 0.04 µm | 0.05 µm | 0.06 µm | 0.08 µm | 0.1 µm |
| ALD Ox process A 100A Purge gas cycling 24 hours | 1434 | 1048 | 924 | 527 | 303 |
| Mechanical gas only particle test RF chucking purge 2 hours | 145 | 94 | 73 | 38 | 20 |
| Mechanical gas only particle test RF chucking purge 1 hour | 33 | 27 | 23 | 14 | 6 |
| Mechanical gas only particle test | 15 | 11 | 10 | 6 | 3 |

In another example, the RF cycling and purging for 1 hour significantly reduced the 2000 Angstrom in-film particle count from ~800 adders to ~100 adders and reduced the processing chamber mechanical particle count. An additional 2 hours of RF cycling and purging further reduced the 2000 A in-film particle count as shown in Table III:

TABLE III

| Particle Tests | 0.06 µm | 0.08 µm | 0.1 µm | 0.12 µm | 0.16 µm | 0.2 µm | 0.5 µm |
|---|---|---|---|---|---|---|---|
| ALD Ox process B 2000A (2800 cycles) | | | | 842 | 448 | 212 | 23 |
| Cycle purge with RF-chucking for 1 hour | | | | | | | |
| Mechanical gas only particle test (2800 cycles) | 30 | 18 | 8 | 8 | 6 | 5 | 2 |
| ALD Ox process B 2000A (2800 cycles) | | | | 130 | 40 | 20 | 7 |
| Cycle purge with RF-chucking for 2 hours | | | | | | | |
| ALD Ox process B 2000A (2800 cycles) | | | | 34 | 11 | 9 | 5 |

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term controller may be replaced with the term circuit. The term controller may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected via interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects. The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc. The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35 U.S.C. §112(f) unless an element is expressly recited using the phrase "means for", or in the case of a method claim using the phrases "operation for" or "step for".

What is claimed is:

1. A method for operating a substrate processing system comprising:
    a) processing a substrate arranged on a substrate support in a processing chamber, wherein at least one of precursor gas and/or reactive gas is supplied during the processing;
    b) removing the substrate from the processing chamber; subsequent to step b):
    c) selectively supplying carrier gas and purge gas to the processing chamber;
    d) generating RF plasma in the processing chamber during N cycles, where N is an integer greater than one, wherein the N cycles include alternating first and second periods, and wherein the RF plasma is on for the first period and off for the second period during each of the N cycles; and
    e) supplying the purge gas during at least part of each of the N cycles of the RF plasma such that (i) the purge gas is not supplied during the first period when the RF plasma is on and (ii) the purge gas is supplied during the second period when the RF plasma is off.

2. The method of claim 1, wherein the at least one of the precursor gas and/or the reactive gas is not supplied during (c), (d) or (e).

3. The method of claim 1, wherein (a) comprises depositing film using RF plasma.

4. The method of claim 1, wherein (a) comprises one of atomic layer deposition (ALD) and chemical vapor deposition (CVD).

5. The method of claim 4, wherein the one of ALD and CVD employs RF plasma.

6. The method of claim 1, wherein a duty cycle of the N cycles is between 25% and 75%.

7. The method of claim 1, wherein (c) is performed during (d) and (e).

8. The method of claim 1, wherein each of the N cycles has a duration between 1 and 5 seconds.

9. The method of claim 1, wherein N is greater than or equal to 100 and less than or equal to 5000.

10. The method of claim 1, wherein at least one of a duty cycle of the N cycles and/or a duration of the N cycles is varied during the N cycles.

* * * * *